US012805314B2

(12) United States Patent
Kajiyama et al.

(10) Patent No.: US 12,805,314 B2
(45) Date of Patent: Nov. 17, 2026

(54) SEMICONDUCTOR MODULE WITH PEENED PROTRUDING AND HARDENED REVERSE METAL PATTERN FOR COOLER ATTACHMENT

(71) Applicant: Mitsubishi Electric Corporation, Tokyo (JP)

(72) Inventors: Riki Kajiyama, Tokyo (JP); Taketoshi Shikano, Tokyo (JP); Kotaro Nishihara, Tokyo (JP); Yasunari Hino, Tokyo (JP); Akira Kosugi, Tokyo (JP); Kazuhiro Nishimura, Fukuoka (JP); Kiyoshi Arai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 353 days.

(21) Appl. No.: 18/632,211

(22) Filed: Apr. 10, 2024

(65) Prior Publication Data

US 2025/0054830 A1 Feb. 13, 2025

(30) Foreign Application Priority Data

Aug. 8, 2023 (JP) ................................ 2023-129169

(51) Int. Cl.
*H10W 40/22* (2026.01)
*H10W 40/25* (2026.01)
(Continued)

(52) U.S. Cl.
CPC ....... *H10W 40/226* (2026.01); *H10W 40/255* (2026.01); *H10W 70/65* (2026.01); (Continued)

(58) Field of Classification Search
CPC ............. H10W 40/226; H10W 40/255; H10W 70/65; H10W 99/00; H10W 74/00; (Continued)

(56) References Cited

U.S. PATENT DOCUMENTS 6,965,157 B1 * 11/2005 Perez .................. H10W 70/048 257/787
8,705,240 B1 * 4/2014 Zohni ................ H05K 7/20509 361/708
(Continued)

FOREIGN PATENT DOCUMENTS

DE 112012006656 B4 * 8/2021 .......... H10W 90/811
JP 2004-214284 A 7/2004
(Continued)

OTHER PUBLICATIONS

"Notice of Reasons for Refusal" Office Action issued in JP 2023-129169; mailed by the Japanese Patent Office on Aug. 4, 2026.

*Primary Examiner* — John P. Dulka
(74) *Attorney, Agent, or Firm* — Studebaker Brackett PLLC

(57) ABSTRACT

An insulating substrate has an insulating plate, an obverse metal pattern, and a reverse metal pattern. A semiconductor chip is mounted on the obverse metal pattern of the insulating substrate. A main terminal is joined to a main electrode on an upper surface of the semiconductor chip. A signal terminal is connected to a control electrode on the upper surface of the semiconductor chip by a wire. A sealing resin seals the insulating substrate, the semiconductor chip, the wire, and a part of the main terminal and a part of the signal termina. The reverse metal pattern protrudes from a lower surface of the sealing resin. A side surface and a lower surface of the reverse metal pattern are exposed from the sealing resin. An exposed surface of the reverse metal pattern is modified and hardened. The reverse metal pattern has a convex shape which bulges downward.

21 Claims, 15 Drawing Sheets

(51) Int. Cl.

| | |
|---|---|
| ***H10W 70/65*** | (2026.01) |
| ***H10W 74/00*** | (2026.01) |
| ***H10W 74/10*** | (2026.01) |
| ***H10W 90/00*** | (2026.01) |
| ***H10W 99/00*** | (2026.01) |

(52) U.S. Cl.
CPC ............ *H10W 99/00* (2026.01); *H10W 74/00* (2026.01); *H10W 74/127* (2026.01); *H10W 90/752* (2026.01); *H10W 90/754* (2026.01); *H10W 90/792* (2026.01); *H10W 90/794* (2026.01)

(58) Field of Classification Search
CPC ............. H10W 74/127; H10W 90/752; H10W 90/754; H10W 90/792; H10W 90/794; H10W 40/22; H10W 74/01; H10W 74/114; H10W 95/00; H10W 90/701; H02M 1/00
See application file for complete search history.

(56) References Cited

U.S. PATENT DOCUMENTS

| | | | | |
|---|---|---|---|---|
| 11,362,008 | B2 * | 6/2022 | Trüssel | H10W 70/6875 |
| 11,955,413 | B2 * | 4/2024 | Tanikawa | B29C 45/14655 |
| 2004/0144561 | A1 * | 7/2004 | Osanai | H10W 40/255 361/720 |
| 2010/0133670 | A1 * | 6/2010 | Liu | H10W 70/461 438/122 |
| 2015/0035138 | A1 | 2/2015 | Miyamoto et al. | |
| 2022/0139803 | A1 | 5/2022 | Hayakashi et al. | |

FOREIGN PATENT DOCUMENTS

| | | | |
|---|---|---|---|
| JP | 2012-142465 | A | 7/2012 |
| JP | 2015-090884 | A | 5/2015 |
| JP | 2019-207897 | A | 12/2019 |
| JP | 2022-074234 | A | 5/2022 |
| WO | 2014006724 | A1 | 1/2014 |

* cited by examiner

SEMICONDUCTOR MODULE WITH PEENED PROTRUDING AND HARDENED REVERSE METAL PATTERN FOR COOLER ATTACHMENT

BACKGROUND OF THE INVENTION

Field

The present disclosure relates to a semiconductor module, a power semiconductor device, a method for manufacturing the semiconductor module, a method for manufacturing the power semiconductor device, and a power conversion device.

Background

There is disclosed a semiconductor module in which a semiconductor chip is soldered to an insulating substrate and a lead is joined to an upper surface of the semiconductor chip and which is sealed with resin by transfer molding (see, for example, Patent Literature 1).

CITATION LIST

Patent Literature

Patent Literature 1: WO 2014-006724 A1

SUMMARY

Technical Problem

Since the semiconductor module is joined to a cooler via thermal grease or solder, there has been a need to improve the reliability of a junction between the semiconductor module and the cooler.

An object of the present disclosure, which has been made to solve the above-described problem, is to obtain a semiconductor module, a power semiconductor device, a method for manufacturing the semiconductor module, a method for manufacturing the power semiconductor device, and a power conversion device, with which the reliability of a junction between the semiconductor module and a cooler can be improved.

Solution to Problem

A semiconductor module according to the present disclosure includes: an insulating substrate having an insulating plate, an obverse metal pattern formed on an obverse side of the insulating plate, and a reverse metal pattern formed on a reverse side of the insulating plate; a semiconductor chip mounted on the obverse metal pattern of the insulating substrate; a main terminal joined to a main electrode on an upper surface of the semiconductor chip; a signal terminal connected to a control electrode on the upper surface of the semiconductor chip by a wire; and a sealing resin sealing the insulating substrate, the semiconductor chip, the wire, and a part of the main terminal and a part of the signal terminal, wherein the reverse metal pattern protrudes from a lower surface of the sealing resin, a side surface and a lower surface of the reverse metal pattern are exposed from the sealing resin, an exposed surface of the reverse metal pattern is modified and hardened, and the reverse metal pattern has a convex shape which bulges downward.

A method for manufacturing the semiconductor module according to the present disclosure includes: mounting a semiconductor chip on an obverse metal pattern of the insulating substrate having an insulating plate, the obverse metal pattern formed on an obverse side of the insulating plate, and a reverse metal pattern formed on a reverse side of the insulating plate; connecting a main terminal to a main electrode on an upper surface of the semiconductor chip; connecting a signal terminal to a control electrode on the upper surface of the semiconductor chip by a wire; sealing the insulating substrate, the semiconductor chip, the wire, and a part of the main terminal and a part of the signal terminal with a sealing resin; and subjecting simultaneously an exposed surface of the reverse metal pattern exposed from a lower surface of the sealing resin and the lower surface of the sealing resin to peening treatment through projection of particles, wherein before the peening treatment, a lower surface of the reverse metal pattern is flush with a lower surface of the sealing resin, after the peening treatment, the reverse metal pattern protrudes from a lower surface of the sealing resin and a side surface of the reverse metal pattern is exposed from the sealing resin, an exposed surface of the reverse metal pattern subjected to the peening treatment is modified and hardened, and the reverse metal pattern subjected to the peening treatment has a convex shape which bulges downward.

Advantageous Effects of Invention

In the present disclosure, the reverse metal pattern protrudes from the lower surface of the sealing resin, and the side surface and the lower surface of the reverse metal pattern are exposed from the sealing resin. The exposed surface of the reverse metal pattern is modified and hardened, and the reverse metal pattern has a convex shape which bulges downward. Thus, it is possible to improve the reliability of a junction between a semiconductor module and a cooler.

DESCRIPTION OF EMBODIMENTS

A semiconductor module, a power semiconductor device, a method for manufacturing the semiconductor module, a method for manufacturing the power semiconductor device, and a power conversion device according to the embodiments of the present disclosure will be described with reference to the drawings. The same components will be denoted by the same symbols, and the repeated description thereof may be omitted.

First Embodiment

Figure 1:
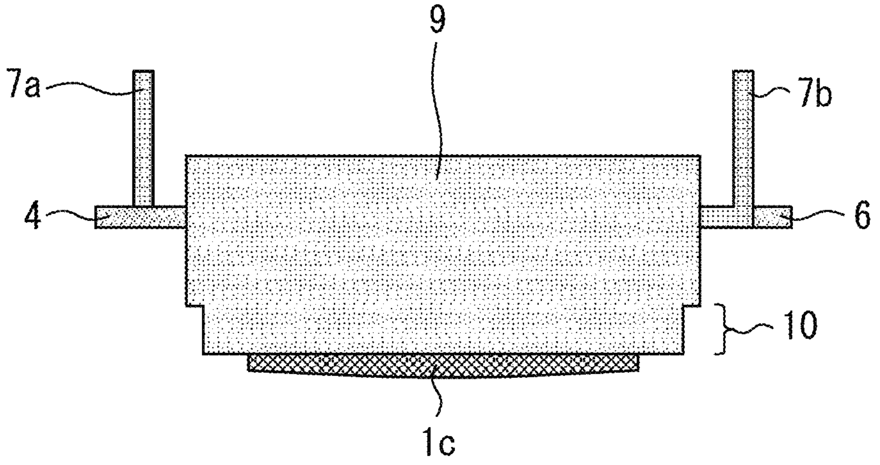
FIG. 1 is a side view showing a semiconductor module according to a first embodiment.
Figure 2:
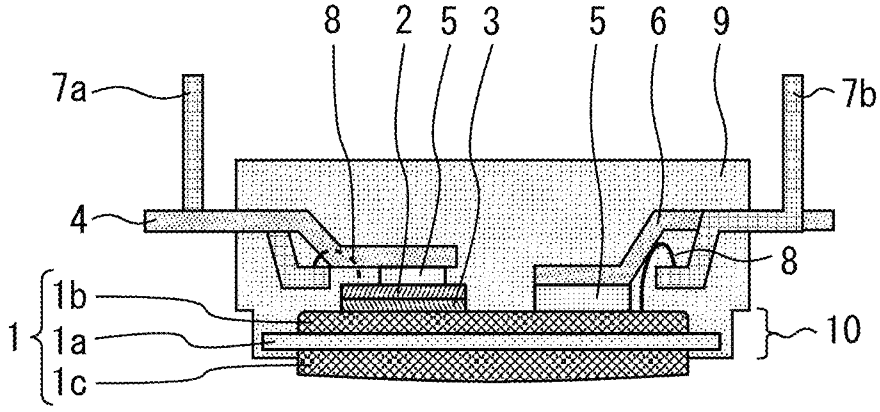
FIG. 2 is a sectional view showing the semiconductor module according to the first embodiment.
Figure 3:
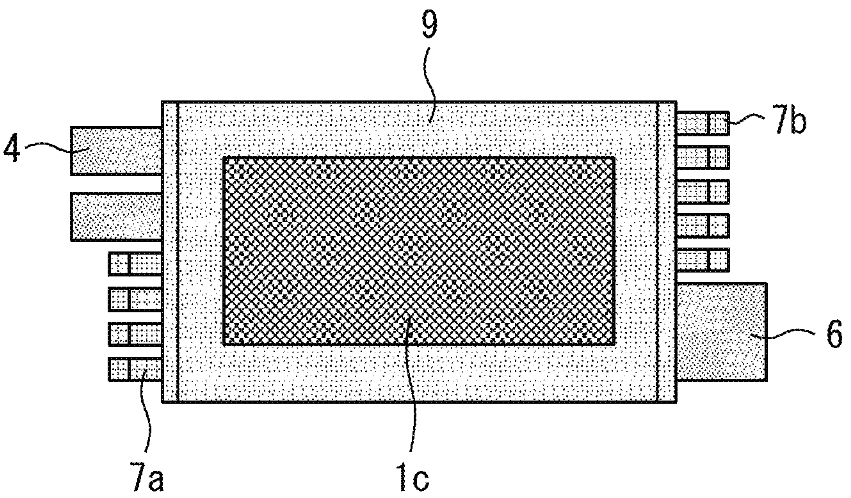
FIG. 3 is a bottom view showing the semiconductor module according to the first embodiment.

FIG. 1 is a side view showing a semiconductor module according to a first embodiment. FIG. 2 is a sectional view showing the semiconductor module according to the first embodiment. FIG. 3 is a bottom view showing the semiconductor module according to the first embodiment.

An insulating substrate 1 has an insulating plate 1*a*, an obverse metal pattern 1*b* which is formed on an obverse side of the insulating plate 1*a*, and a reverse metal pattern 1*c* which is formed on a reverse side of the insulating plate 1*a*. The insulating plate 1*a* is made of ceramic, such as AlN (aluminum nitride), $Al_2O_3$ (alumina), or $Si_3N_4$ (silicon nitride).

The obverse metal pattern 1*b* and the reverse metal pattern 1*c* are each made of a conductive metal which is, for example, a metal including copper or aluminum as the main ingredient. The obverse metal pattern 1*b* and the reverse metal pattern 1*c* are joined to the insulating plate 1*a* by brazing. Thicknesses of the obverse metal pattern 1*b* and the reverse metal pattern 1*c* are 0.2 to 1.0 mm. The thicknesses of both the metal patterns may be the same or different. The thicknesses of the obverse metal pattern 1*b* and the reverse metal pattern 1*c* are determined by a specification (rated current) of the semiconductor module. The thicker these patterns are, the higher current the semiconductor module supports, and the more the semiconductor module can be miniaturized.

A semiconductor chip 2 is mounted on the obverse metal pattern 1*b* of the insulating substrate 1. A lower-surface electrode of the semiconductor chip 2 is joined to the obverse metal pattern 1*b* of the insulating substrate 1 via a joining material 3. The joining material 3 is a sintered material which is composed of fine metal powder.

A main electrode on an upper surface of the semiconductor chip 2 is joined to a main terminal 4 via a joining material 5. A different main terminal 6 is joined to the obverse metal pattern 1*b* of the insulating substrate 1 via the joining material 5. Although the joining material 5 is solder, the joining material 5 may be a sintered material. A control electrode on the upper surface of the semiconductor chip 2 is connected to a signal terminal 7*a* by a wire 8. The obverse metal pattern 1*b* is connected to a signal terminal 7*b* by the wire 8. The main terminals 4 and 6 and the signal terminals 7*a* and 7*b* are each made of a conductive metal, such as copper or a copper alloy. The respective wires 8 are made of a conductive metal including as the main ingredient any of aluminum, gold, silver, and copper and are ultrasonic-joined to the control electrode of the semiconductor chip 2 and the signal terminal 7*a*, and the obverse metal pattern 1*b* and the signal terminal 7*b*.

The semiconductor chip 2 is a diode, a MOSFET (Metal-Oxide-Semiconductor Field-Effect Transistor), an IGBT (Insulated-Gate Bipolar Transistor), or an RC-IGBT (Reverse-Conducting IGBT). The semiconductor chip 2 may be a semiconductor chip having a plurality of functions. For example, if the semiconductor chip 2 is formed by integrating a gate balance resistor, a control circuit pattern, and a temperature sensor on an Si substrate, the flexibility in layout is improved, which allows miniaturization, increase in power density, and reduction in cost. Detection of a temperature of the semiconductor chip 2 makes it possible to maximize an effective area of the semiconductor chip 2 in view of a distribution of heat generated in the semiconductor module.

The insulating substrate 1, the semiconductor chip 2, the wires 8, and parts of the main terminal 4 and 6 and the signal terminals 7*a* and 7*b* are sealed with a sealing resin 9 which provides excellent mass productivity (by transfer molding). Although the sealing resin 9 is mainly composed of epoxy resin, the sealing resin 9 is not limited to this. A thermosetting resin having a desired elastic modulus and desired adhesion can be used.

The main terminals 4 and 6 and the signal terminals 7*a* and 7*b* protrude from a side surface of the sealing resin 9. The signal terminals 7*a* and 7*b* are formed to extend upward. The main terminals 4 and 6 may be similarly formed to extend upward. Distal ends of the main terminals 4 and 6 and the signal terminals 7*a* and 7*b* are connected to a control board or external wiring (not shown). The reverse metal pattern 1*c* of the insulating substrate 1 is exposed at a middle portion of a lower surface of the sealing resin 9. The reverse metal pattern 1*c* protrudes from the lower surface of the sealing resin 9 by 50 to 200 μm. A stepped portion 10 is provided at a peripheral portion of the lower surface of the sealing resin 9 in the semiconductor module.

An exposed surface of the reverse metal pattern 1*c* of the insulating substrate 1 is subjected to peening treatment through, for example, laser irradiation or projection of fine particles including, as the main ingredient, any of metal, resin, and ceramic. The exposed surface of the reverse metal pattern 1*c* that is modified and hardened by the peening treatment has a characteristic uneven shape commensurate with particle diameters of particles to be projected by peening treatment. For this reason, surface roughness Ra of the exposed surface of the reverse metal pattern 1*c* that is modified and hardened is 2 to 15 μm and is larger than surface roughness of the obverse metal pattern 1*b*.

Since the exposed surface of the reverse metal pattern 1*c* is modified and hardened and is plastically deformed, the reverse metal pattern 1*c* as a whole has a convex shape which bulges downward. A height difference (warp amount) between end portions and a middle portion of the exposed surface of the reverse metal pattern 1*c* is 50 to 200 μm.

Figure 4:
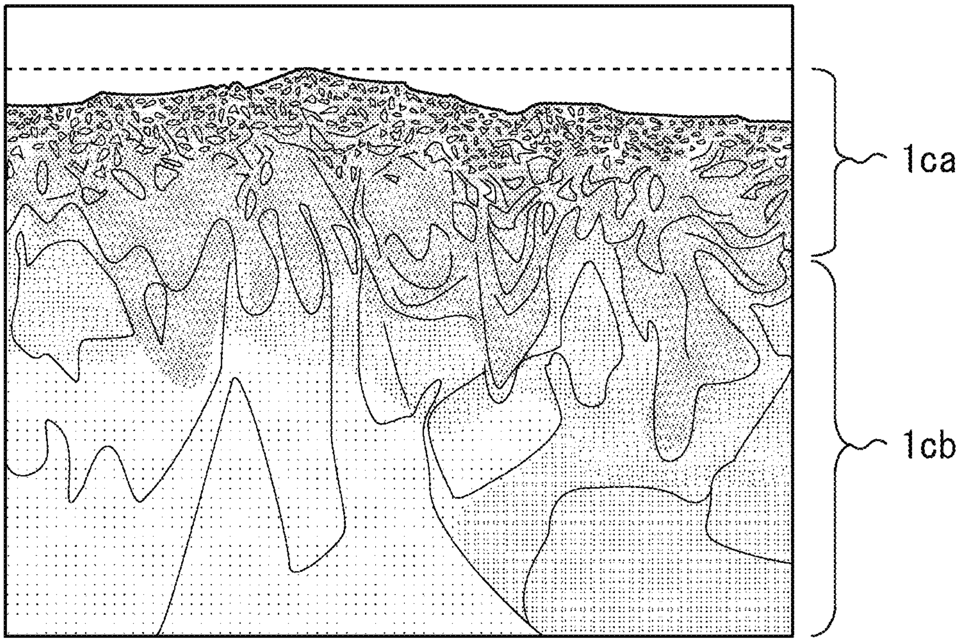
FIG. 4 is a sectional view showing a reverse metal pattern which is modified and hardened.

FIG. 4 is a sectional view showing a reverse metal pattern which is modified and hardened. A superficial layer 1*ca* extending from a lower surface to a depth of 20 to 30 μm of the reverse metal pattern 1*c* is modified and hardened. A grain size of a metallic material for the superficial layer 1*ca* is finer than a grain size of a metallic material for an interior 1*cb* of the reverse metal pattern 1*c* which is not modified and hardened.

Figure 5:
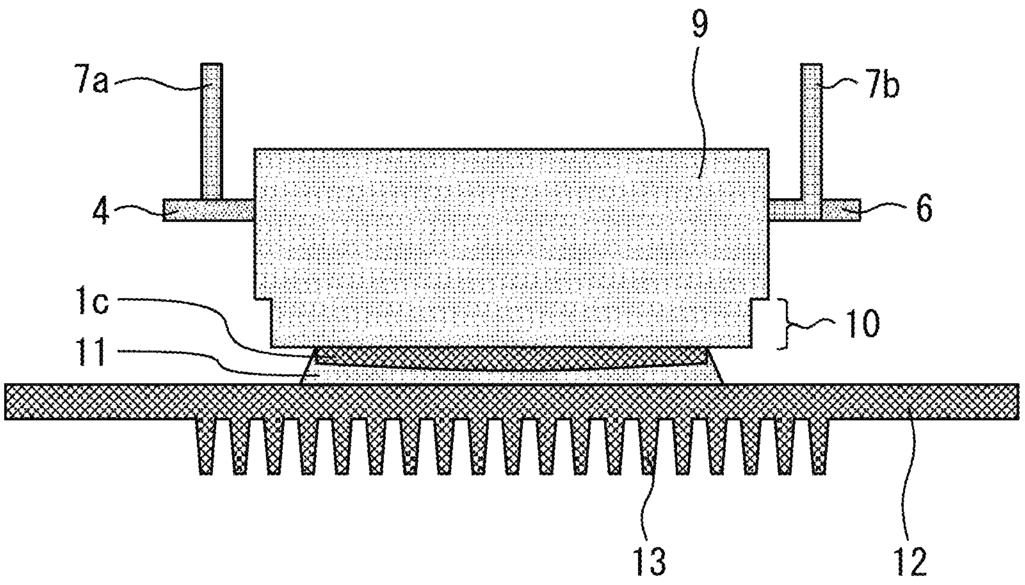
FIG. 5 is a side view showing a power semiconductor device according to the first embodiment.

FIG. 5 is a side view showing a power semiconductor device according to the first embodiment. A cooler 12 is joined to the exposed lower surface and an exposed side surface of the reverse metal pattern 1*c* in the semiconductor module by a joining material 11 so as to support a higher current density. The cooler 12 is made of, for example, an alloy including copper or aluminum as the main ingredient. A plurality of fins 13 which are circular cylinders or rectangular cylinders are formed on a lower surface of a flat plate of the cooler 12. The plurality of fins 13 may be integral with the flat plate or may be joined to the flat plate via a joining material.

As the joining material 11, solder is used. If the cooler 12 is made of aluminum or an aluminum alloy, Ni-based or Sn-based plating is applied to an upper surface of the cooler 12 to ensure solderability. Note that an insulative thermal grease, such as a thermal interface material, may be used as the joining material 11. Heat dissipation of the semiconductor chip 2 is improved with soldering, as compared to use of thermal grease.

Figure 6:
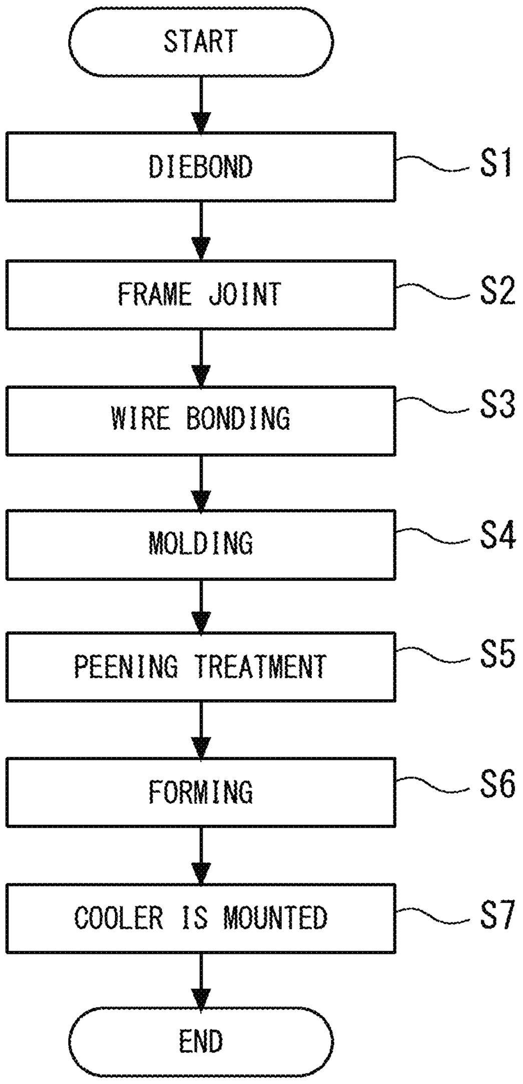
FIG. 6 is a flowchart showing a method for manufacturing the semiconductor module and the power semiconductor device according to the first embodiment.
Figure 7:
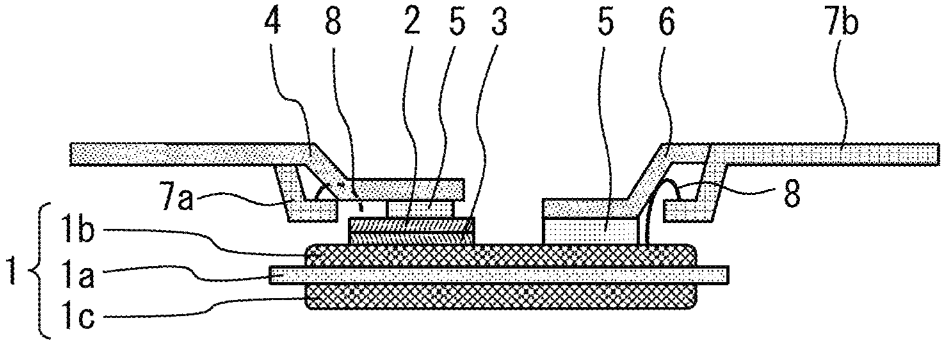
FIG. 7 is a sectional view showing a method for manufacturing the semiconductor module according to the first embodiment.
Figure 8:
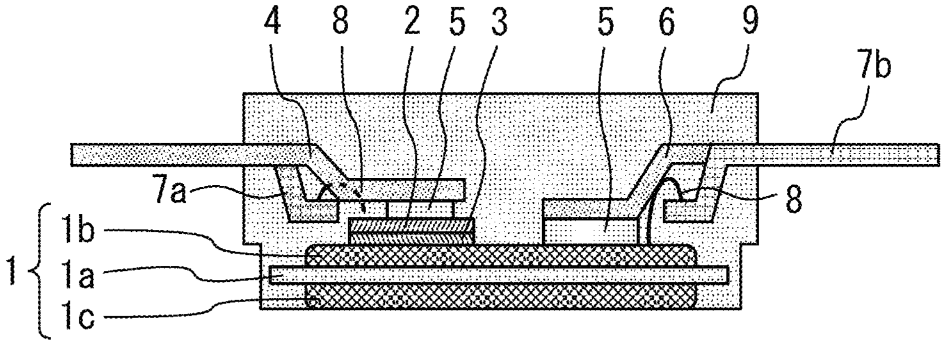
FIG. 8 is a sectional view showing a method for manufacturing the semiconductor module according to the first embodiment.

FIG. 6 is a flowchart showing a method for manufacturing the semiconductor module and the power semiconductor device according to the first embodiment. FIGS. 7 and 8 are sectional views showing a method for manufacturing the semiconductor module according to the first embodiment. FIG. 7 shows a state after wire bonding in FIG. 6, and FIG. 8 shows a state after molding in FIG. 6.

First, the insulating substrate 1 is set in a printing machine, and the joining material 3, which is in a paste form of 100 to 200 μm in thickness and which is shaped using a metal mask, is applied to an upper surface of the obverse metal pattern 1*b* by printing. The insulating substrate 1, to which the joining material 3 is applied, and the semiconductor chip 2 are set in a surface mounting machine, and the semiconductor chip 2 is mounted on the obverse metal pattern 1*b* of the insulating substrate 1 under load (step S1). The insulating substrate 1 and the semiconductor chip 2 are set in a reflow furnace, and solvent is dried under a nitrogen atmosphere. As shown in FIG. 7, the lower-surface electrode of the semiconductor chip 2 and the obverse metal pattern 1*b* of the insulating substrate 1 are joined with the joining material 3.

The main terminal 4 is joined to an upper-surface electrode of the semiconductor chip 2 by the joining material 5 (step S2). The main terminal 6 is joined to the obverse metal pattern 1*b* by the joining material 5. The joining may be achieved by simultaneously melting the joining materials 3 and 5. For example, the insulating substrate 1, on which the semiconductor chip 2 is mounted, and the main terminals 4 and 6 are installed on a lower jig which is made of a material high in thermal conductivity and are fixedly held by an upper jig which is made of a material high in thermal conductivity. The insulating substrate 1, the main terminals 4 and 6, and the upper and lower jigs are put in a device at 200 to 300° C. under a reducing atmosphere ($N_2$, $H_2$), and melted solder is applied or solid solder is melted. With these operations, the main terminal 4 and the semiconductor chip 2 are soldered together, and the main terminal 6 and the obverse metal pattern 1*b* are soldered together. After that, a resultant product is moved to a cooling stage and is cooled.

The wire 8 is ultrasonic-joined to the control electrode of the semiconductor chip 2 and the signal terminal 7*a* to connect the control electrode of the semiconductor chip 2 and the signal terminal 7*a*, and the wire 8 is ultrasonic-joined to the obverse metal pattern 1*b* and the signal terminal 7*b* to connect the obverse metal pattern 1*b* and the signal terminal 7*b* (step S3).

The transfer molding is performed, in which the thermosetting sealing resin 9 is heated and poured into a heated mold, achieving pressure molding (step S4). For example, the insulating substrate 1, the semiconductor chip 2, and the like are set in the mold, whose temperature is raised to 150 to 200° C., and the sealing resin 9 is poured and hardened to seal the insulating substrate 1, the semiconductor chip 2, and the like and form an outer shape. With this operation, the insulating substrate 1, the semiconductor chip 2, the wires 8, parts of the main terminals 4 and 6, parts of the signal terminals 7*a* and 7*b*, and the like are sealed with the sealing resin 9. After the molding is completed, the article is taken out from the mold and put in an oven at 150 to 200° C. for after-cure. In the molded article, the stepped portion 10 is formed at the peripheral portion of the lower surface of the sealing resin 9 due to a shape of the mold. When an unnecessary terminal portion and an unnecessary resin flashes are removed from the molded article with the mold, a configuration in FIG. 8 is obtained.

The exposed surface of the reverse metal pattern 1*c* that is exposed from the lower surface of the sealing resin 9 and the lower surface of the sealing resin 9 are simultaneously subjected to peening treatment (step S5). In the peening treatment, fine particles are projected onto the surfaces. One-time treatment of the entire lower surface of the reverse metal pattern 1*c* allows uniform treatment. After that, the surfaces are rinsed and dried. The exposed surface of the reverse metal pattern 1*c* subjected to the peening treatment is modified and hardened, and the reverse metal pattern 1*c* has a convex shape which bulges downward.

Before the peening treatment, the lower surface of the sealing resin 9 is flush with the exposed surface of the reverse metal pattern 1*c*, and the reverse metal pattern 1*c* does not protrude from the lower surface of the sealing resin 9. With the peening treatment, the sealing resin 9 is etched from a lower surface side, the reverse metal pattern 1*c* protrudes from the lower surface of the sealing resin 9, and the side surface of the reverse metal pattern 1*c* is exposed from the sealing resin 9. Note that since a bottom surface of a mold is generally flat in transfer molding, it is difficult to cause the reverse metal pattern 1*c* to protrude from the lower surface of the sealing resin 9 by transfer molding.

Plating is applied to the main terminals 4 and 6 and the signal terminals 7*a* and 7*b* as needed. The plating has a material composition including Sn or Ni as the main ingredient. The plating improves solderability and prevents corrosion. The main terminals 4 and 6 and the signal terminals 7*a* and 7*b* are each bent into a shape which allows easy connection to an external terminal (step S6). With these process steps, the semiconductor module according to the present embodiment is manufactured. The side surface and the lower surface of the reverse metal pattern 1*c* of the semiconductor module and the cooler 12 are joined by the joining material 11 (step S7). With the above-described process steps, the power semiconductor device according to the present embodiment is manufactured.

As has been described above, in the present embodiment, the reverse metal pattern 1*c* protrudes from the lower surface of the sealing resin 9, and the side surface and the lower surface of the reverse metal pattern 1*c* are exposed from the sealing resin 9. Thus, solder in contact with the exposed surface of the reverse metal pattern 1*c* has an ideal soldered shape, which improves solderability.

The exposed surface of the reverse metal pattern 1*c* is modified and hardened by peening treatment and is plastically deformed. For this reason, the grain size of the metallic material for the superficial layer 1*ca* of the reverse metal pattern 1*c* is finer than the grain size of the metallic material for the interior 1*cb* of the reverse metal pattern 1*c* that is not modified and hardened. For example, if the reverse metal pattern 1*c* is made of copper, when measurements are made by a Vickers hardness test, hardness of the superficial layer 1*ca* that is modified and hardened is about 83 and is twice hardness of about 48 of the interior 1*cb* that is not modified and hardened. Work-hardening of the superficial layer 1*ca* of the reverse metal pattern 1*c* improves strength. Thus, a tolerance to a shearing stress which occurs at a solder junction due to a long-term repeated thermal stress in an environment where the power semiconductor device is used improves, which allows inhibition of development of cracks.

Generally, a semiconductor module is mounted on a cooler via non-metallic thermal grease, such as a thermal interface material, in order to reduce a contact thermal resistance. If a reverse side of the semiconductor module has a concave shape which dents upward at this time, a thickness of the thermal interface material at a middle portion may become large. Since a rate of thermal conduction of the non-metallic thermal interface material is 2 to 3 W/m·K, thermal resistances of the semiconductor module and the cooler may become high. In contrast, in the present embodiment, the reverse metal pattern 1*c* subjected to peening treatment has a convex shape which bulges downward. For this reason, the semiconductor module can be mounted on the cooler without increasing thermal resistances. This results in improvement of durability and fatigue strength.

A semiconductor module is composed of a plurality of members different in thermal expansion coefficient. For this reason, operation of a semiconductor chip changes a temperature of the semiconductor module and generates a thermal stress in each member. As a result, the entire semiconductor module is deformed to warp. If a conventional semiconductor module is mounted on a cooler with a thermal interface material, the thermal interface material pumps out gradually due to warp deformation to flow outward. This increases a contact thermal resistance between the semiconductor module and the cooler and promotes degradation of a semiconductor chip. In contrast, in the present embodiment, the reverse metal pattern 1*c* of the insulating substrate 1 is modified and hardened by peening treatment and is improved in strength, and warp deformation of the entire semiconductor module can be inhibited. This allows prevention of pumping out of a thermal interface material and curbing of increase in contact thermal resistance between the semiconductor module and the cooler.

Thus, the present embodiment can improve the reliability of a junction between a semiconductor module and a cooler. As a result, a long-life, high-reliability power semiconductor device can be provided.

The exposed surface of the reverse metal pattern 1*c* that is modified and hardened is in an uneven surface state, and the surface roughness thereof is larger than the surface roughness of the obverse metal pattern 1*b*. Thus, at the time of soldering the exposed surface of the reverse metal pattern 1*c* to the cooler 12, the anchor effect improves joining strength. This allows inhibition of development of cracks.

The thicknesses of the obverse metal pattern 1*b* and the reverse metal pattern 1*c* are each 0.2 to 1 mm, and a thickness of the insulating plate 1*a* is 0.2 to 1.0 mm. With the combination of the thicknesses, the lower surface of the reverse metal pattern 1*c* is plastically deformed to be extended by peening treatment. This forms the reverse metal pattern 1*c* as a whole into a convex shape which bulges downward. Note that the idea of, in a conventional semiconductor module in which an insulating substrate is mounted on a base plate, subjecting the base plate that is present all over a lower surface of the module to peening treatment is also conceivable. However, even if the base plate that originally has high rigidity and is as thick as 3 to 5 mm is subjected to the peening treatment, this does not go far enough to generate a warp of 50 to 200 μm required of a semiconductor module.

The insulating plate 1*a* of the insulating substrate 1 is made of ceramic, such as AlN high in thermal conductivity. For this reason, a rise in the temperature of the semiconductor chip 2 can be curbed by dissipating heat of the semiconductor chip 2 to the cooler 12 via the insulating plate 1*a*. As a result, it is possible to curb power loss and ensure a switching characteristic, the life, and the reliability of the semiconductor module.

The main terminals 4 and 6 protrude from the side surface of the sealing resin 9, and the stepped portion 10 is formed at the peripheral portion of the lower surface of the sealing resin 9. With this configuration, creeping distances between the main terminals 4 and 6 of the semiconductor module and the upper surface of the cooler 12 can be ensured, and insulation can be ensured.

Second Embodiment

Figure 9:
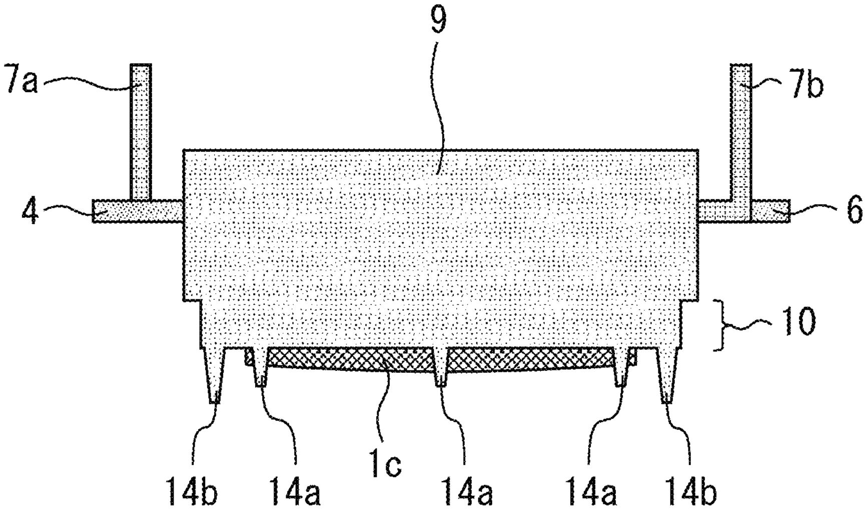
FIG. 9 is a side view showing a semiconductor module according to a second embodiment.
Figure 10:
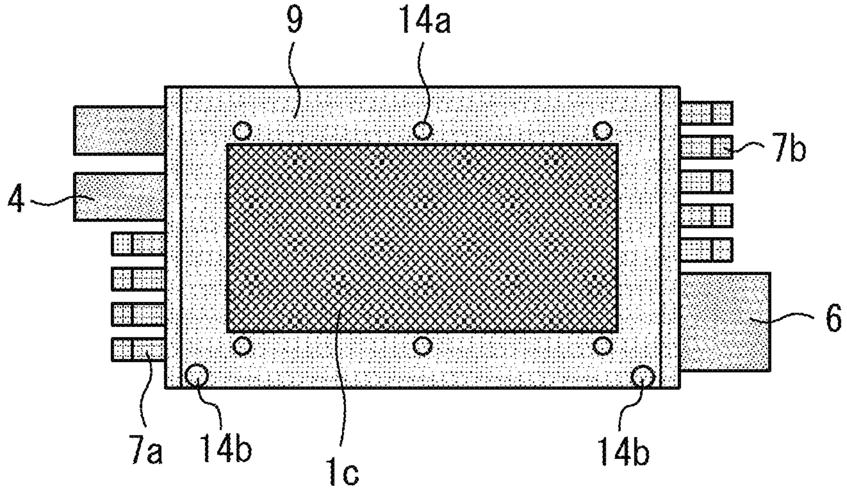
FIG. 10 is a bottom view showing the semiconductor module according to the second embodiment.

FIG. 9 is a side view showing a semiconductor module according to a second embodiment. FIG. 10 is a bottom view showing the semiconductor module according to the second embodiment. First projections 14*a* and second projections 14*b* are formed on a lower surface of a sealing resin 9. The first projections 14*a* and the second projections 14*b* are each a part of the sealing resin 9 and are simultaneously formed at the time of sealing a semiconductor chip 2 and the like. The second projections 14*b* are longer than the first projections 14*a*. The first projections 14*a* are formed adjacent to a reverse metal pattern 1*c*. Specifically, two first projections 14*a* are formed so as to hold a middle portion in a longitudinal direction of the reverse metal pattern 1*c* from both sides. Four first projections 14*a* are formed at four corners of the reverse metal pattern 1*c*.

Figure 11:
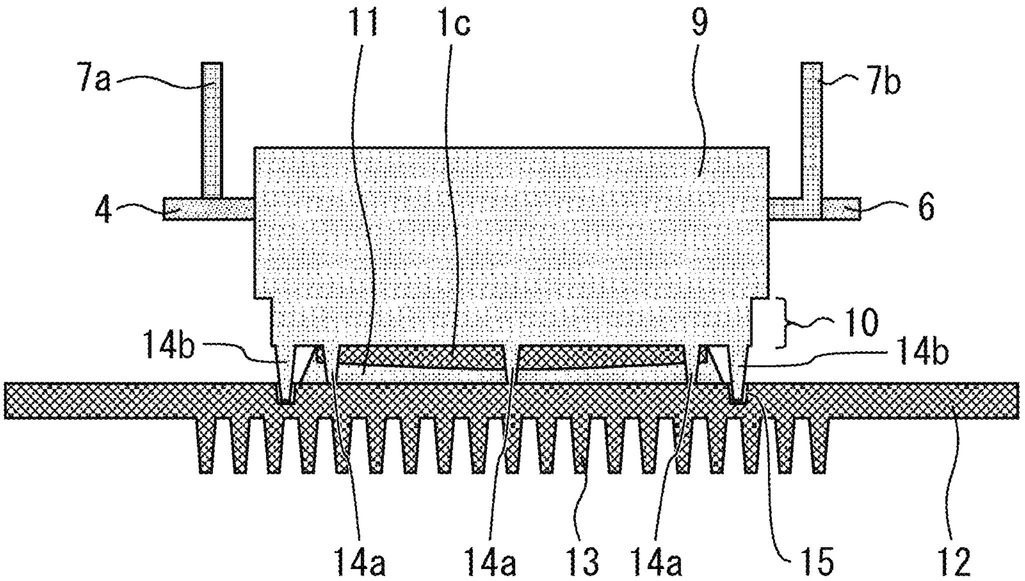
FIG. 11 is a side view showing a power semiconductor device according to the second embodiment.
Figure 12:
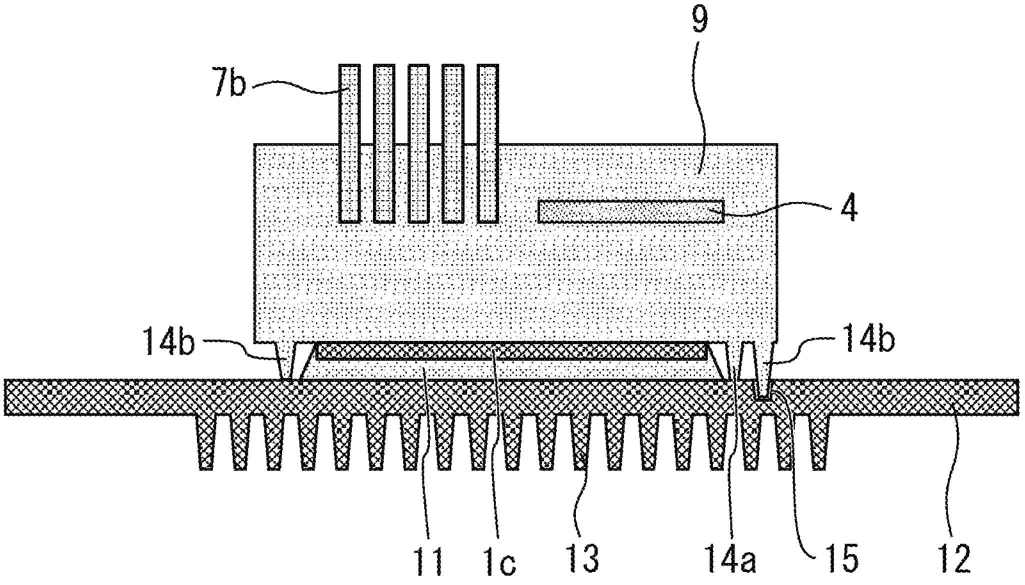
FIG. 12 is a side view showing a power semiconductor device according to the second embodiment.

FIGS. 11 and 12 are side views showing a power semiconductor device according to the second embodiment. FIGS. 11 and 12 are side views as viewed from directions which differ by 90° from each other. The reverse metal pattern 1*c* that is modified and hardened has a convex shape which bulges downward. Since the reverse metal pattern 1*c* warps in the longitudinal direction, a thickness of a joining material 11 is smaller at the middle portion in the longitudinal direction of the reverse metal pattern 1*c* and increases toward end portions. The thickness at the middle portion of the joining material 11 only needs to be 50 μm or more. The second projections 14*b* of the semiconductor module come into contact with, are guided by, and are fit into concave portions 15 which are formed in an upper surface of a cooler 12.

Figure 13:
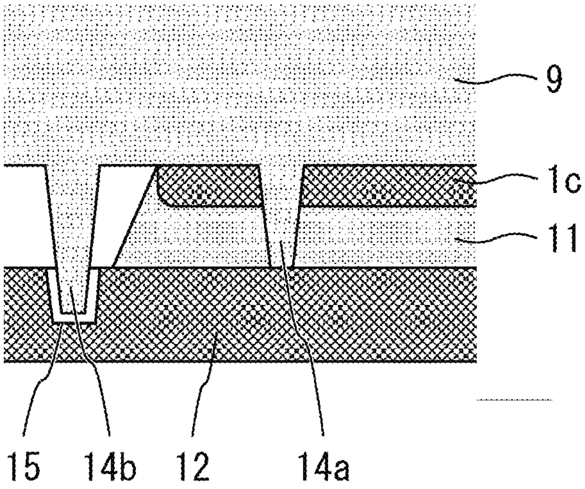
FIG. 13 is a side view of an enlarged junction of the power semiconductor device according to the second embodiment.

FIG. 13 is a side view of an enlarged junction of the power semiconductor device according to the second embodiment. Not only a lower surface of the reverse metal pattern 1*c* but also a side surface is joined to the joining material 11, and the joining material 11 forms a desired fillet. With the first projections 14*a* of the semiconductor module, the thickness of the joining material 11 can be ensured.

A method for manufacturing the power semiconductor device according to the present embodiment will be described. First, the semiconductor module is manufactured by steps S1 to S6 as in the first embodiment. The joining material 11 in solid form is arranged at a predetermined position of the upper surface of the cooler 12. The second projections 14*b* of the semiconductor module are fit in the concave portions 15 of the cooler 12 to position the semiconductor module. The semiconductor module and the cooler 12 are put in a reflow furnace, the joining material 11 is heated, and the reverse metal pattern 1*c* of the semiconductor module and the cooler 12 are joined by the joining material 11. After that, the power semiconductor device is cooled and is taken out from the reflow furnace. Note that a sintered material may be used as the joining material 11 instead of solder. With the above-described process steps, the power semiconductor device according to the present embodiment is manufactured.

As has been described above, in the present embodiment, the first projections 14*a* allow ensuring of the thickness of the joining material 11 that is made of thermal grease or solder between the reverse metal pattern 1*c* and the cooler 12. This makes it possible to attach the semiconductor module to the cooler 12 without increasing thermal resistances. Development of cracks can be inhibited, and a high-reliability, long-life power semiconductor device can be obtained.

With the plurality of first projections 14*a* formed on the lower surface of the sealing resin 9, the semiconductor module can be horizontally loaded on the upper surface of the cooler 12. For this reason, the semiconductor module does not incline, and a desired joining thickness can be ensured from the middle portion of the reverse metal pattern 1*c* to the ends.

The second projections 14*b* of the semiconductor module come into contact with, are guided by, and are fit into the concave portions 15 formed in the upper surface of the cooler 12. This makes positioning of the semiconductor module easy. Note that although only one semiconductor module is loaded on the cooler 12 in FIGS. 11 and 12, a plurality of semiconductor modules are generally loaded as inverter devices on the cooler 12. For this reason, fitting the second projections 14*b* of each semiconductor module and the concave portions 15 of the cooler 12 together makes assembly of the plurality of semiconductor modules easy and improves productivity. The second projections 14*b* are formed closer to a periphery of the lower surface of the sealing resin 9 than the first projections 14*a* are so as not to interfere with the first projections 14*a* for ensuring a solder thickness.

Figure 14:
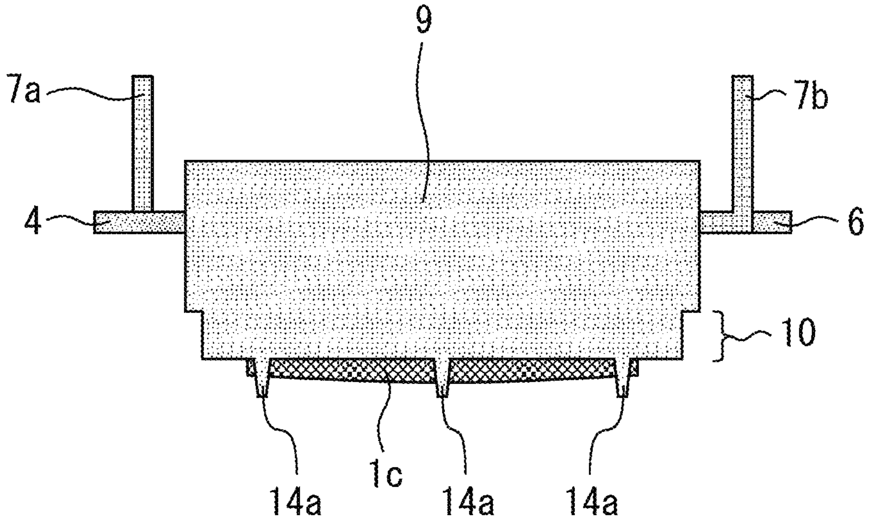
FIG. 14 is a side view showing a modification of the semiconductor module according to the second embodiment.
Figure 15:
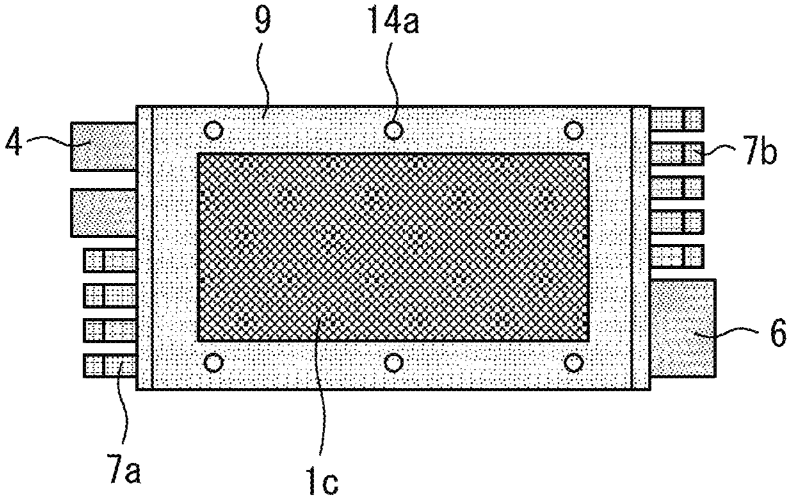
FIG. 15 is a bottom view showing the modification of the semiconductor module according to the second embodiment.

FIG. 14 is a side view showing a modification of the semiconductor module according to the second embodiment. FIG. 15 is a bottom view showing the modification of the semiconductor module according to the second embodiment. Although the first projections 14*a* are formed on a lower surface of the sealing resin 9, the second projections 14*b* are not formed. With the plurality of first projections 14*a* formed on the lower surface of the sealing resin 9, a thickness of the joining material 11 can be ensured between the reverse metal pattern 1*c* and the cooler 12, and the semiconductor module can be horizontally loaded on the upper surface of the cooler 12.

Third Embodiment

Figure 16:
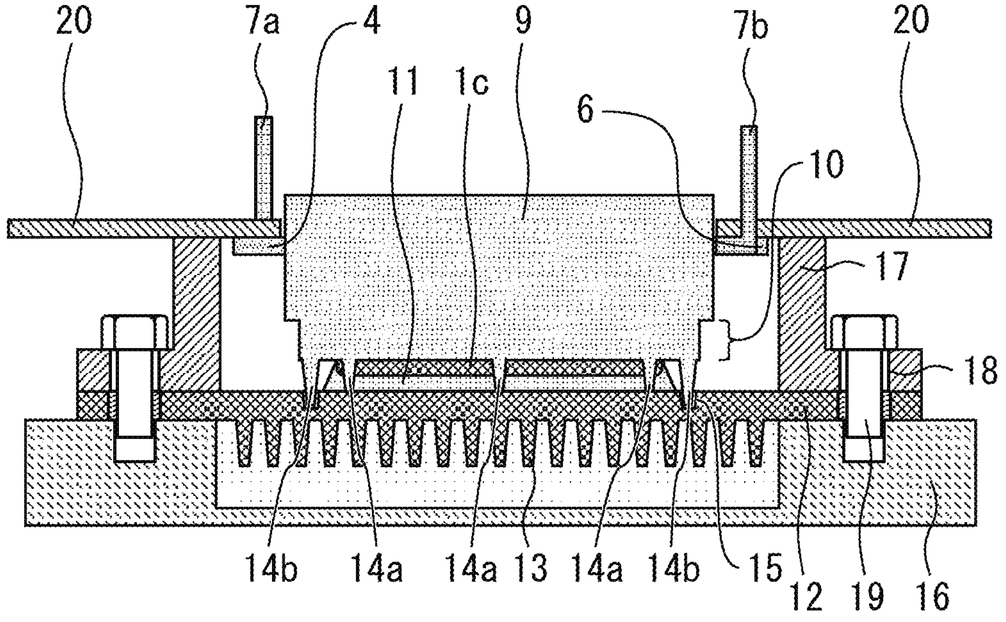
FIG. 16 is a sectional view showing a power semiconductor device according to a third embodiment.

FIG. 16 is a sectional view showing a power semiconductor device according to a third embodiment. Note that an interior of a sealing resin 9 is not shown. A lower cooler 16 which is arranged on a lower surface of a cooler 12 on which a semiconductor module is loaded. A resin case 17 is arranged on the cooler 12 so as to surround the semiconductor module. A screw 19 is fastened to the coolers 12 and 16 through a mounting hole 18 which is formed at an end of the resin case 17. A main terminal 4 which protrudes from a side surface of the sealing resin 9 is supported by the resin case 17. The main terminal 4 and an external terminal 20 lie flatly on top of each other and are soldered or laser-joined to each other.

The coolers 12 and 16 are of a water-cooled type and are very excellent in heat dissipation. Cooling liquid flows in an interior of the lower cooler 16, and heat from a semiconductor chip 2 can be efficiently dissipated via a plurality of fins 13 of the cooler 12. A cooling capacity improves greatly, and the semiconductor module and the power semiconductor device can be miniaturized. Since heat dissipation of the semiconductor chip 2 improves, desired power switching can be achieved without degradation in characteristics, and the reliability of the power semiconductor device can be ensured. Other components and advantageous effects are the same as in the first and second embodiments.

Figure 17:
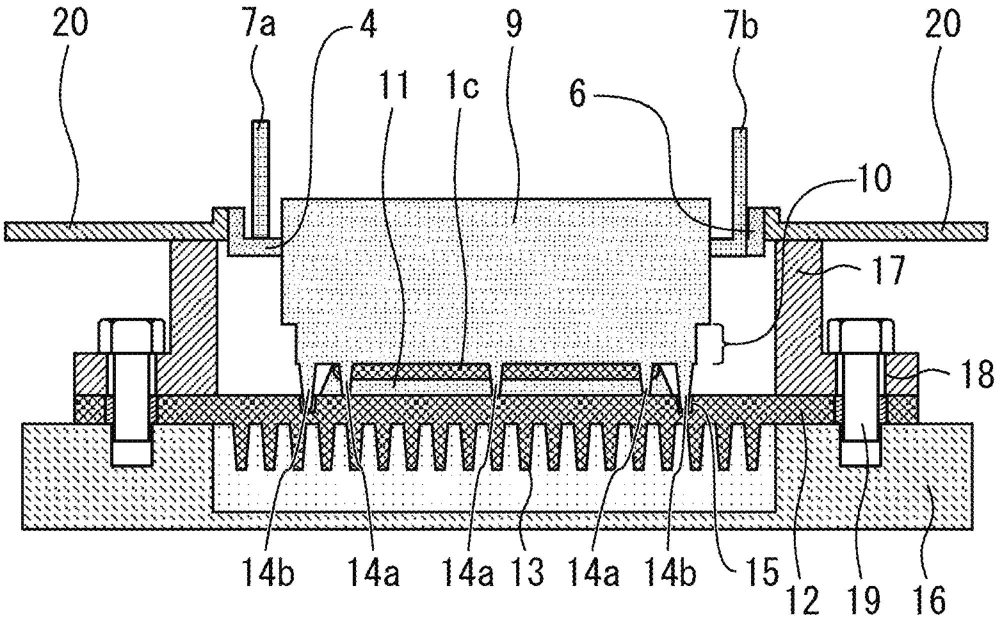
FIG. 17 is a sectional view showing a modification of the power semiconductor device according to the third embodiment.

FIG. 17 is a sectional view showing a modification of the power semiconductor device according to the third embodiment. The main terminal 4 and the external terminal 20 are formed to extend upward and are soldered or laser-joined to each other. Other components are the same as in FIG. 16.

Figure 18:
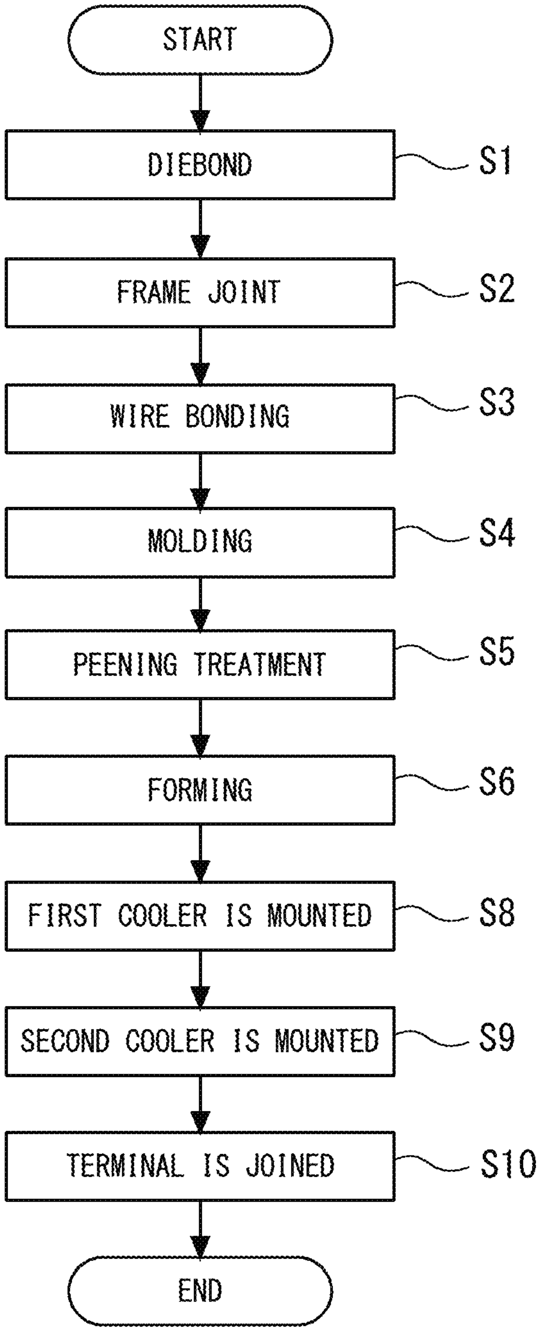
FIG. 18 is a flowchart showing a method for manufacturing the semiconductor module and the power semiconductor device according to the third embodiment.

FIG. 18 is a flowchart showing a method for manufacturing the semiconductor module and the power semiconductor device according to the third embodiment. First, the semiconductor module is manufactured by steps S1 to S6 as in the first embodiment.

A joining material 11 in solid form is arranged at a predetermined position of the upper surface of the cooler 12. Second projections 14*b* of the semiconductor module are fit in concave portions 15 of the cooler 12 to position the semiconductor module. The semiconductor module and the cooler 12 are put in a reflow furnace, the joining material 11 is heated, and the reverse metal pattern 1*c* of the semiconductor module and the cooler 12 are joined by the joining material 11 (step S8). After that, the power semiconductor device is cooled and is taken out from the reflow furnace. Note that a sintered material may be used as the joining material 11 instead of solder.

The resin case 17 is arranged on the cooler 12 so as to surround the semiconductor module and support the main terminal 4 from below. The lower cooler 16 is arranged on the lower surface of the cooler 12. The screws 19 are fastened to the coolers 12 and 16 through the mounting holes 18 formed in the resin case 17 (step S9). Note that a sealing material may be inserted between the cooler 12 and the lower cooler 16 or the cooler 12 and the lower cooler 16 may be bonded via an adhesive.

The main terminal 4 and the external terminal 20 are soldered or laser-joined to each other (step S10). Note that the main terminal 4 and the external terminal 20 may be laser-joined via solder. With the above-described process steps, the power semiconductor device according to the present embodiment is manufactured.

Fourth Embodiment

Figure 19:
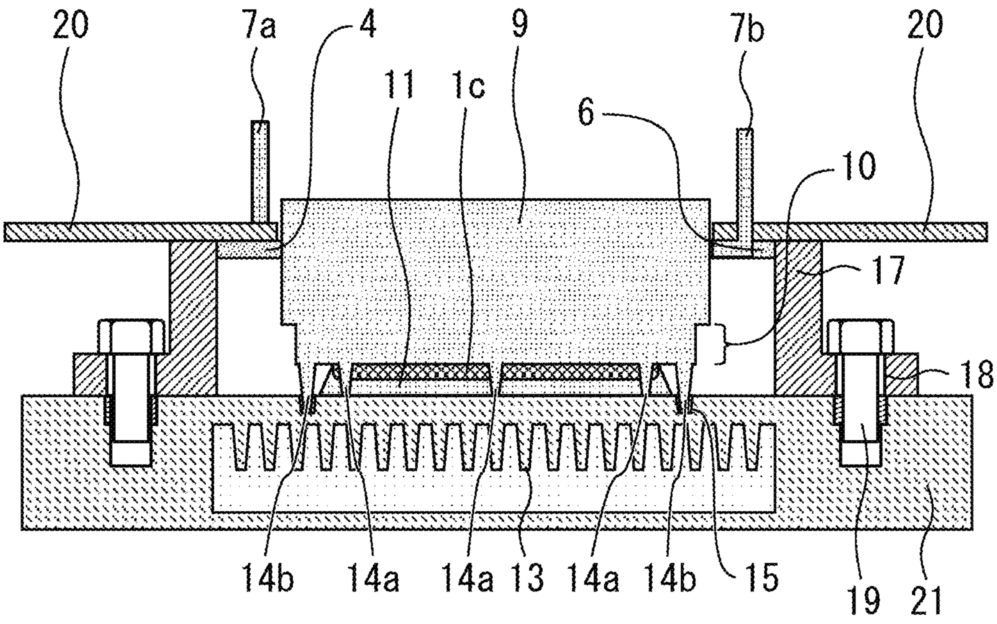
FIG. 19 is a sectional view showing a power semiconductor device according to a fourth embodiment.

FIG. 19 is a sectional view showing a power semiconductor device according to a fourth embodiment. Note that an interior of a sealing resin 9 is not shown.

As in the third embodiment, a semiconductor module is joined to an upper surface of a cooler 21 by a joining material 11. Second projections 14*b* of the semiconductor module are fit in concave portions 15 which are formed in the upper surface of the cooler 21 to position the semiconductor module. With first projections 14*a*, a thickness of the joining material 11 can be ensured. A resin case 17 is arranged so as to surround the semiconductor module and support a main terminal 4 from below. A screw 19 is fastened to the cooler 21 through a mounting hole 18 which is formed in the resin case 17. The main terminal 4 that protrudes from a side surface of the sealing resin 9 is supported by the resin case 17. The main terminal 4 and an external terminal 20 lie flatly on top of each other and are soldered or laser-joined to each other.

The cooler 21 according to the present embodiment is an integrated combination of the coolers 12 and 16 of the third embodiment. The cooler 21 is made of, for example, an alloy including copper or aluminum as the main ingredient. The cooler 21 is of a water-cooled type and is very excellent in heat dissipation. Cooling liquid flows in an interior of the cooler 21, and heat from a semiconductor chip 2 can be efficiently dissipated via a plurality of fins 13 which are formed in the interior of the cooler 21.

Figure 20:
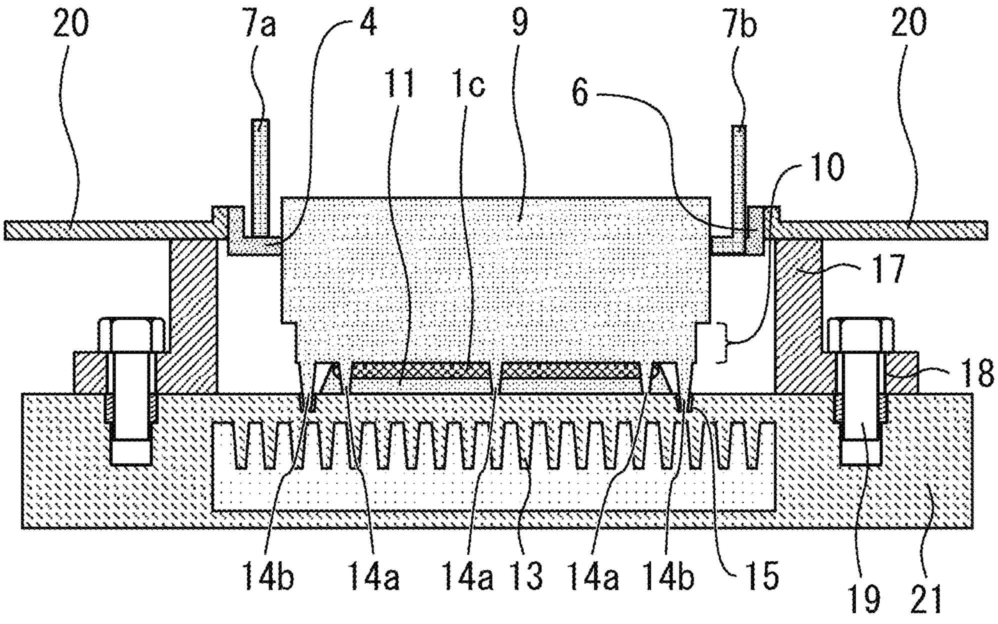
FIG. 20 is a sectional view showing a modification of the power semiconductor device according to the fourth embodiment.

FIG. 20 is a sectional view showing a modification of the power semiconductor device according to the fourth embodiment. The main terminal 4 and the external terminal 20 are formed to extend upward and are soldered or laser-joined to each other. Other components are the same as in FIG. 19.

Figure 21:
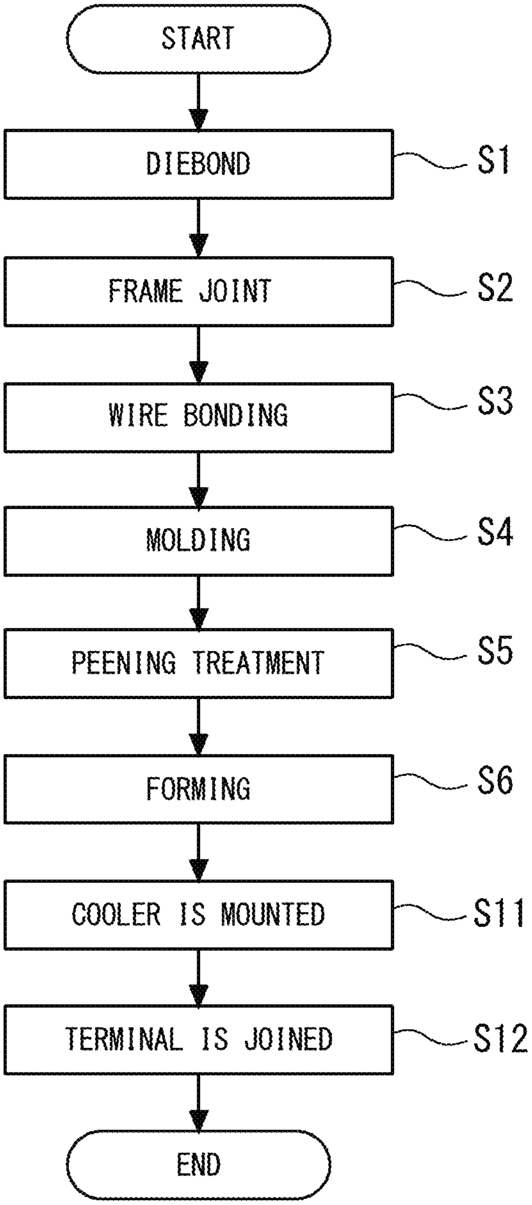
FIG. 21 is a flowchart showing a method for manufacturing the semiconductor module and the power semiconductor device according to the fourth embodiment.

FIG. 21 is a flowchart showing a method for manufacturing the semiconductor module and the power semiconductor device according to the fourth embodiment. First, the semiconductor module is manufactured by steps S1 to S6 as in the first embodiment.

The joining material 11 in solid form is arranged at a predetermined position of the upper surface of the cooler 21. The second projections 14*b* of the semiconductor module are fit in the concave portions 15 formed in the upper surface of the cooler 21 to position the semiconductor module. The resin case 17 is arranged on the cooler 21 so as to surround the semiconductor module and support the main terminal 4 from below. The screws 19 are fastened to the cooler 21 through the mounting holes 18 formed in the resin case 17. The semiconductor module and the cooler 21 are put in a reflow furnace, the joining material 11 is heated, and a reverse metal pattern 1*c* of the semiconductor module and the cooler 21 are joined by the joining material 11 (step S11). After that, the power semiconductor device is cooled and is taken out from the reflow furnace. Note that a sintered material may be used as the joining material 11 instead of solder.

The main terminal 4 and the external terminal 20 are soldered or laser-joined to each other (step S12). Note that the main terminal 4 and the external terminal 20 may be laser-joined via solder. With the above-described process steps, the power semiconductor device according to the present embodiment is manufactured.

The semiconductor chip 2 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Fifth Embodiment

In this embodiment, the power semiconductor devices according to the first to fourth embodiments described above are applied to an power conversion device. Although the present disclosure is not limited to a specific power conversion device, a case where the present disclosure is applied to a three-phase inverter will be described below as a Fifth Embodiment.

Figure 22:
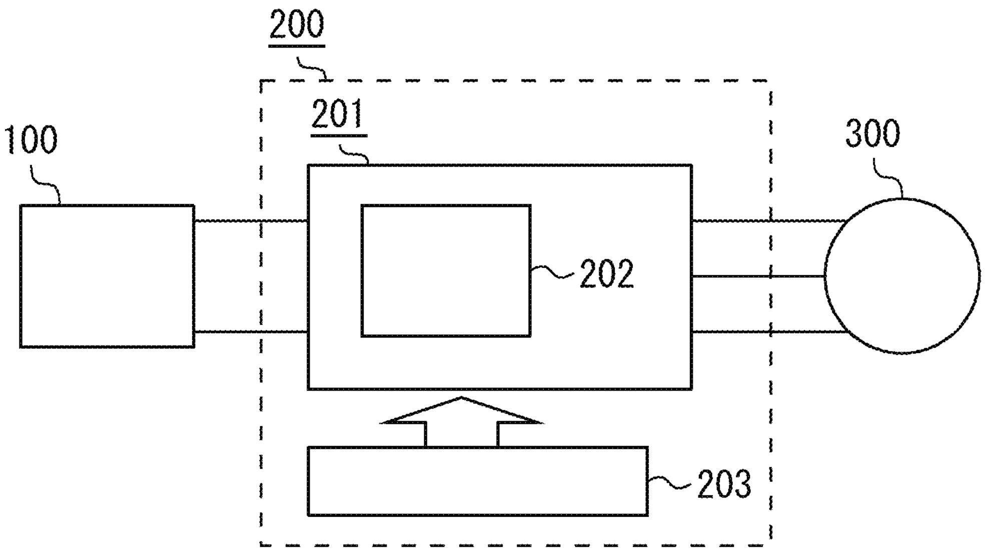
FIG. 22 is a block diagram illustrating a configuration of an electric power conversion system to which the power conversion device according to the fifth embodiment is applied.

FIG. 22 is a block diagram illustrating a configuration of an electric power conversion system to which the power conversion device according to the fifth embodiment is applied. This electric power conversion system includes a power supply 100, an power conversion device 200, and a load 300. The power supply 100 is a DC power supply and supplies DC power to the power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The power conversion device 200 is a three-phase inverter connected to a node between the power supply 100 and the load 300, converts DC power supplied from the power supply 100 into AC power, and supplies the AC power to the load 300. The power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the power conversion device according to this embodiment, the semiconductor devices according to the first to fourth embodiments are applied as the semiconductor device 202. Accordingly, it is possible to improve the reliability of a junction between a semiconductor module and a cooler.

While this embodiment illustrates an example in which the present disclosure is applied to a two-level three-phase inverter, the present disclosure is not limited to this and can be applied to various power conversion devices. While this embodiment illustrates a two-level power conversion device, the present disclosure can also be applied to a three-level or multi-level power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the power conversion device may be used as a power conditioner for a photovoltaic power generating system, an electricity storage system, or the like.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

(Supplementary Note 1)

A semiconductor module comprising:

an insulating substrate having an insulating plate, an obverse metal pattern formed on an obverse side of the insulating plate, and a reverse metal pattern formed on a reverse side of the insulating plate;

a semiconductor chip mounted on the obverse metal pattern of the insulating substrate;

a main terminal joined to a main electrode on an upper surface of the semiconductor chip;

a signal terminal connected to a control electrode on the upper surface of the semiconductor chip by a wire; and a sealing resin sealing the insulating substrate, the semiconductor chip, the wire, and a part of the main terminal and a part of the signal terminal, wherein the reverse metal pattern protrudes from a lower surface of the sealing resin, a side surface and a lower surface of the reverse metal pattern are exposed from the sealing resin, an exposed surface of the reverse metal pattern is modified and hardened, and the reverse metal pattern has a convex shape which bulges downward.

(Supplementary Note 2)

The semiconductor module according to Supplementary Note 1, wherein a grain size of a metallic material for a superficial layer of the reverse metal pattern which is modified and hardened is finer than a grain size of a metallic material for an interior of the reverse metal pattern which is not modified and hardened.

(Supplementary Note 3)

The semiconductor module according to Supplementary Note 2, wherein surface roughness of an exposed surface of the reverse metal pattern that is modified and hardened is larger than surface roughness of the obverse metal pattern.

(Supplementary Note 4)

The semiconductor module according to any one of Supplementary Notes 1 to 3, wherein thicknesses of the obverse metal pattern and the reverse metal pattern are each 0.2 to 1 mm, and a thickness of the insulating plate is 0.2 to 1.0 mm.

(Supplementary Note 5)

The semiconductor module according to any one of Supplementary Notes 1 to 4, wherein the insulating plate is made of ceramic.

(Supplementary Note 6)

The semiconductor module according to any one of Supplementary Notes 1 to 5, wherein the main terminal protrudes from a side surface of the sealing resin, and a stepped portion is formed at a peripheral portion of a lower surface of the sealing resin.

(Supplementary Note 7)

The semiconductor module according to any one of Supplementary Notes 1 to 6, wherein a projection is formed on a lower surface of the sealing resin.

(Supplementary Note 8)

The semiconductor module according to Supplementary Note 7, wherein the projection includes a first projection and a second projection which is longer than the first projection.

(Supplementary Note 9)

The semiconductor module according to Supplementary Note 8, wherein the first projection is formed adjacent to the reverse metal pattern, and the second projection is formed closer to a periphery of the lower surface of the sealing resin than the first projection.

(Supplementary Note 10)

The semiconductor module according to any one of Supplementary Notes 1 to 9, wherein the semiconductor chip is made of a wide-band-gap semiconductor.

(Supplementary Note 11)

A power semiconductor device comprising:

the semiconductor module according to any one of Supplementary Notes 1 to 10; and a cooler joined to a side surface and a lower surface of the reverse metal pattern of the semiconductor module by a joining material.

(Supplementary Note 12)

A power semiconductor device comprising:

the semiconductor module according to Supplementary Note 7; and a cooler joined to a side surface and a lower surface of the reverse metal pattern of the semiconductor module by a joining material, wherein a concave portion is formed in an upper surface of a cooler, and the projection of the semiconductor module is fit into the concave portion.

(Supplementary Note 13)

A power semiconductor device comprising:

the semiconductor module according to Supplementary Note 8; and a cooler joined to a side surface and a lower surface of the reverse metal pattern of the semiconductor module by a joining material, wherein a concave portion is formed in an upper surface of a cooler, and the second projection is fit into the concave portion.

(Supplementary Note 14)

The power semiconductor device according to any one of Supplementary Notes 11 to 13, wherein a plurality of fins are formed on a lower surface of the cooler.

(Supplementary Note 15)

The power semiconductor device according to any one of Supplementary Notes 11 to 14, wherein the cooler is of a water-cooled type.

(Supplementary Note 16)

A method for manufacturing the semiconductor module comprising:

mounting a semiconductor chip on an obverse metal pattern of the insulating substrate having an insulating plate, the obverse metal pattern formed on an obverse side of the insulating plate, and a reverse metal pattern formed on a reverse side of the insulating plate;

connecting a main terminal to a main electrode on an upper surface of the semiconductor chip;

connecting a signal terminal to a control electrode on the upper surface of the semiconductor chip by a wire;

sealing the insulating substrate, the semiconductor chip, the wire, and a part of the main terminal and a part of the signal terminal with a sealing resin; and subjecting simultaneously an exposed surface of the reverse metal pattern exposed from a lower surface of the sealing resin and the lower surface of the sealing resin to peening treatment through projection of particles, wherein before the peening treatment, a lower surface of the reverse metal pattern is flush with a lower surface of the sealing resin, after the peening treatment, the reverse metal pattern protrudes from a lower surface of the sealing resin and a side surface of the reverse metal pattern is exposed from the sealing resin, an exposed surface of the reverse metal pattern subjected to the peening treatment is modified and hardened, and the reverse metal pattern subjected to the peening treatment has a convex shape which bulges downward.

(Supplementary Note 17)

A method for manufacturing the power semiconductor device comprising:

manufacturing a semiconductor module by the method according to Supplementary Note 16; and joining a cooler to a side surface and a lower surface of the reverse metal pattern of the semiconductor module by a joining material.

(Supplementary Note 18)

The method for manufacturing the power semiconductor device according to Supplementary Note 17, comprising:

arranging a resin case on the cooler so as to surround the semiconductor module;

arranging a lower cooler on a lower surface of the cooler; and fastening a screw to the cooler and the lower cooler through a mounting hole formed at the resin case.

(Supplementary Note 19)

The method for manufacturing the power semiconductor device according to Supplementary Note 17, comprising:

arranging a resin case on the cooler so as to surround the semiconductor module; and fastening a screw to the cooler through a mounting hole formed at the resin case.

(Supplementary Note 20)

The method for manufacturing the power semiconductor device according to any one of Supplementary Notes 17 to 19, comprising:

forming a projection on a lower surface of the sealing resin;

forming a concave portion in an upper surface of a cooler; and fitting the projection into the concave portion.

(Supplementary Note 21)

A power conversion device comprising:

a main conversion circuit including the power semiconductor device according to any one of Supplementary Notes 11 to 15, converting input power and outputting converted power; and a control circuit outputting a control signal for controlling the main conversion circuit to the main conversion circuit.

REFERENCE SIGNS LIST

1 insulating substrate; 1*a* insulating plate; 1*b* obverse metal pattern; 1*c* reverse metal pattern; 1*ca* superficial layer; 1*cb* interior; 2 semiconductor chip; 3,5,11 joining material; 4,6 main terminal; 7*a*, 7*b* signal terminal; 8 wire; 9 sealing resin; 10 stepped portion; 12,21 cooler; 13 a plurality of fins; 14*a* first projection; 14*b* second projection; 15 concave portion; 16 lower cooler; 17 resin case; 18 mounting hole; 19 screw; 20 external terminal; 200 power conversion device; 201 main conversion circuit; 202 semiconductor device; 203 control circuit Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2023-129169, filed on Aug. 8, 2023 including specification, claims, drawings and summary, on which the convention priority of the present application is based, is incorporated herein by reference in its entirety.

The invention claimed is:

1. A semiconductor module comprising:

an insulating substrate having an insulating plate, an obverse metal pattern formed on an obverse side of the insulating plate, and a reverse metal pattern formed on a reverse side of the insulating plate;

a semiconductor chip mounted on the obverse metal pattern of the insulating substrate;

a main terminal joined to a main electrode on an upper surface of the semiconductor chip;

a signal terminal connected to a control electrode on the upper surface of the semiconductor chip by a wire; and a sealing resin sealing the insulating substrate, the semiconductor chip, the wire, and a part of the main terminal and a part of the signal terminal, wherein the reverse metal pattern protrudes from a lower surface of the sealing resin, a side surface and a lower surface of the reverse metal pattern are exposed from the sealing resin, an exposed surface of the reverse metal pattern is modified and hardened, and the reverse metal pattern has a convex shape which bulges downward.

2. The semiconductor module according to claim 1, wherein a grain size of a metallic material for a superficial layer of the reverse metal pattern which is modified and hardened is finer than a grain size of a metallic material for an interior of the reverse metal pattern which is not modified and hardened.

3. The semiconductor module according to claim 2, wherein surface roughness of an exposed surface of the reverse metal pattern that is modified and hardened is larger than surface roughness of the obverse metal pattern.

4. The semiconductor module according to claim 1, wherein thicknesses of the obverse metal pattern and the reverse metal pattern are each 0.2 to 1 mm, and a thickness of the insulating plate is 0.2 to 1.0 mm.

5. The semiconductor module according to claim 1, wherein the insulating plate is made of ceramic.

6. The semiconductor module according to claim 1, wherein the main terminal protrudes from a side surface of the sealing resin, and a stepped portion is formed at a peripheral portion of a lower surface of the sealing resin.

7. The semiconductor module according to claim 1, wherein a projection is formed on a lower surface of the sealing resin.

8. The semiconductor module according to claim 7, wherein the projection includes a first projection and a second projection which is longer than the first projection.

9. The semiconductor module according to claim 8, wherein the first projection is formed adjacent to the reverse metal pattern, and the second projection is formed closer to a periphery of the lower surface of the sealing resin than the first projection.

10. A power semiconductor device comprising:

the semiconductor module according to claim 8; and a cooler joined to a side surface and a lower surface of the reverse metal pattern of the semiconductor module by a joining material, wherein a concave portion is formed in an upper surface of a cooler, and the second projection is fit into the concave portion.

11. A power semiconductor device comprising:

the semiconductor module according to claim 7; and a cooler joined to a side surface and a lower surface of the reverse metal pattern of the semiconductor module by a joining material, wherein a concave portion is formed in an upper surface of a cooler, and the projection of the semiconductor module is fit into the concave portion.

12. The semiconductor module according to claim 1, wherein the semiconductor chip is made of a wide-band-gap semiconductor.

13. A power semiconductor device comprising:

the semiconductor module according to claim 1; and a cooler joined to a side surface and a lower surface of the reverse metal pattern of the semiconductor module by a joining material.

14. The power semiconductor device according to claim 13, wherein a plurality of fins are formed on a lower surface of the cooler.

15. The power semiconductor device according to claim 13, wherein the cooler is of a water-cooled type.

16. A power conversion device comprising:

a main conversion circuit including the power semiconductor device according to claim 13, converting input power and outputting converted power; and a control circuit outputting a control signal for controlling the main conversion circuit to the main conversion circuit.

17. A method for manufacturing the semiconductor module comprising:

mounting a semiconductor chip on an obverse metal pattern of the insulating substrate having an insulating plate, the obverse metal pattern formed on an obverse side of the insulating plate, and a reverse metal pattern formed on a reverse side of the insulating plate;

connecting a main terminal to a main electrode on an upper surface of the semiconductor chip;

connecting a signal terminal to a control electrode on the upper surface of the semiconductor chip by a wire;

sealing the insulating substrate, the semiconductor chip, the wire, and a part of the main terminal and a part of the signal terminal with a sealing resin; and subjecting simultaneously an exposed surface of the reverse metal pattern exposed from a lower surface of the sealing resin and the lower surface of the sealing resin to peening treatment through projection of particles, wherein before the peening treatment, a lower surface of the reverse metal pattern is flush with a lower surface of the sealing resin, after the peening treatment, the reverse metal pattern protrudes from a lower surface of the sealing resin and a side surface of the reverse metal pattern is exposed from the sealing resin, an exposed surface of the reverse metal pattern subjected to the peening treatment is modified and hardened, and the reverse metal pattern subjected to the peening treatment has a convex shape which bulges downward.

18. A method for manufacturing the power semiconductor device comprising:

manufacturing a semiconductor module by the method according to claim 17; and joining a cooler to a side surface and a lower surface of the reverse metal pattern of the semiconductor module by a joining material.

19. The method for manufacturing the power semiconductor device according to claim 18, comprising:

arranging a resin case on the cooler so as to surround the semiconductor module;

arranging a lower cooler on a lower surface of the cooler; and fastening a screw to the cooler and the lower cooler through a mounting hole formed at the resin case.

20. The method for manufacturing the power semiconductor device according to claim 18, comprising:

arranging a resin case on the cooler so as to surround the semiconductor module; and fastening a screw to the cooler through a mounting hole formed at the resin case.

21. The method for manufacturing the power semiconductor device according to claim 18, comprising:

forming a projection on a lower surface of the sealing resin;

forming a concave portion in an upper surface of a cooler; and fitting the projection into the concave portion.

* * * * *